United States Patent
Zeng et al.

(10) Patent No.: US 9,922,706 B2
(45) Date of Patent: Mar. 20, 2018

(54) SOLID STATE STORAGE DEVICE USING STATE PREDICTION METHOD

(71) Applicants: Lite-On Electronics (Guangzhou) Limited, Guangzhou (CN); LITE-ON TECHNOLOGY CORPORATION, Taipei (TW)

(72) Inventors: Shih-Jia Zeng, Taipei (TW); Jen-Chien Fu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 26 days.

(21) Appl. No.: 15/215,913

(22) Filed: Jul. 21, 2016

(65) Prior Publication Data
US 2017/0345489 A1    Nov. 30, 2017

(30) Foreign Application Priority Data
May 31, 2016 (CN) .......................... 2016 1 0378726

(51) Int. Cl.
| | |
|---|---|
| G11C 29/00 | (2006.01) |
| G11C 11/56 | (2006.01) |
| G06F 3/06 | (2006.01) |
| G06F 11/10 | (2006.01) |
| G11C 16/04 | (2006.01) |
| G11C 16/10 | (2006.01) |
| G11C 16/26 | (2006.01) |
| G11C 29/52 | (2006.01) |

(52) U.S. Cl.
CPC .......... *G11C 11/5642* (2013.01); *G06F 3/064* (2013.01); *G06F 3/0611* (2013.01); *G06F 3/0619* (2013.01); *G06F 3/0652* (2013.01); *G06F 3/0653* (2013.01); *G06F 3/0679* (2013.01); *G06F 11/1068* (2013.01); *G11C 11/5628* (2013.01); *G11C 16/0408* (2013.01); *G11C 16/0483* (2013.01); *G11C 16/10* (2013.01); *G11C 16/26* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 9,251,909 B1 * | 2/2016 | Camp | G11C 16/3427 |
| 9,711,231 B1 * | 7/2017 | Yip | G11C 16/28 |
| 9,727,276 B2 * | 8/2017 | Darragh | G06F 3/0653 |
| 2008/0181012 A1 * | 7/2008 | Richter | G11C 16/10 365/185.21 |

(Continued)

*Primary Examiner* — Daniel McMahon
(74) *Attorney, Agent, or Firm* — WPAT, PC

(57) ABSTRACT

A solid state storage includes a non-volatile memory and a controlling circuit. The non-volatile memory includes a first block. The controlling circuit is connected with the non-volatile memory. The controlling circuit includes a function storage circuit. The function storage circuit stores plural prediction functions. According to plural state parameters corresponding to the first block and a first prediction function of the plural prediction functions, the controlling circuit predicts a read voltage shift of the first block.

11 Claims, 4 Drawing Sheets

(56) References Cited

U.S. PATENT DOCUMENTS

2012/0272024 A1* 10/2012 Park .................. G11C 16/3418
711/162
2016/0180959 A1* 6/2016 Darragh ................ G06F 3/0653
365/185.09

* cited by examiner

| | Program time (Pt) | Erase time (Et) | Error bit number (Eb) | Read voltage shift (Vrb) | Decoding process (Dp) | 2-month read voltage shift (Vrb') | 2-month decoding process (Dp') |
|---|---|---|---|---|---|---|---|
| Block_1 | 1894 | 5615 | 55 | -3 | A | -5 | A |
| Block_2 | 1725 | 6441 | 76 | -5 | A | -9 | B |
| Block_3 | 2034 | 6342 | 102 | -8 | B | -12 | C |
| Block_4 | 2188 | 5983 | 153 | -10 | C | -15 | Fail |
| ... | | | | | | | |
| Block_N-1 | 1649 | 7212 | 203 | +15 | C | +2 | C |
| Block_N | 1523 | 7420 | 188 | -13 | C | -19 | Fail |

FIG. 5

SOLID STATE STORAGE DEVICE USING STATE PREDICTION METHOD

This application claims the benefit of People's Republic of China Patent Application No. 201610378726.8, filed May 31, 2016, the subject matter of which is incorporated herein by reference.

FIELD OF THE INVENTION

The present invention relates to a solid state storage device, and more particularly to a solid state storage device using a state prediction method.

BACKGROUND OF THE INVENTION

As is well known, solid state storage devices such as SD cards or solid state drives (SSD) are widely used in a variety of electronic devices. Generally, a solid state storage device comprises a controlling circuit and a non-volatile memory. FIG. 1 is a schematic functional block diagram illustrating a conventional solid state storage device. As shown in FIG. 1, the solid state storage device 10 is connected with a host 14 through an external bus 12. Generally, the external bus 12 is a USB bus, a SATA bus, a PCIe bus, or the like. Moreover, the solid state storage device 10 comprises a controlling circuit 101 and a non-volatile memory 105. The controlling circuit 101 is connected with the non-volatile memory 105 through an internal bus 107. According to a command from the host 14, the controlling circuit 101 stores the received write data into the non-volatile memory 105, or the controlling circuit 101 acquires a read data from the non-volatile memory 105 and transmits the read data to the host 14.

Generally, the controlling circuit 101 stores a default read voltage set. During a read cycle, the controlling circuit 101 judges the read data of the non-volatile memory 105 according to the default read voltage set.

The controlling circuit 101 further comprises an error correction (ECC) circuit 104 and a retry table 106. The ECC unit 104 is used for correcting the error bits of the read data. After the error bits of the read data are corrected, accurate read data are transmitted to the host 14. However, if the ECC unit 104 is unable to successfully correct all bits of the read data, the ECC unit 10 cannot output the accurate read data to the host 14. Under this circumstance, the retry table 106 provides another retry read voltage set to the controlling circuit 101. According to the retry read voltage set, the controlling circuit 101 performs a read retry operation on the non-volatile memory 105.

The non-volatile memory 105 such as a flash memory comprises a memory array (not shown). The memory array comprises plural memory cells. In the memory array, each memory cell comprises a floating gate transistor. Depending on the amount of data to be stored in the memory cell, the flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

Moreover, the floating gate of the floating gate transistor of each memory cell can store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the non-volatile memory 105, the amount of hot carriers to be injected into the floating gate is controlled by the controlling circuit 101. Consequently, the threshold voltage of the floating gate transistor is correspondingly changed. During a read cycle, the controlling circuit 101 provides a read voltage to the floating gate of the floating gate transistor and determines the storing state of the floating gate transistor by judging whether the floating gate transistor is turned on.

FIG. 2A schematically illustrates the threshold voltage distribution curves of the MLC flash memory in different storing states. Each cell of the MLC flash memory has four storing states E, A, B and C according to the amount of the injected hot carriers. Before the hot carriers are injected into the cell, the cell is in a storing state E. According to the number of hot carriers injected into the cell, the cell has the storing state A, the storing state B or the storing state C. The cell in the storing state C has the highest threshold voltage. The cell in the storing state E has the lowest threshold voltage. After an erase cycle, the cell is returned to the storing state E where no hot carriers are injected into the cell.

Moreover, each cell of the SLC flash memory has two storing states, and each cell of the TLC flash memory has eight storing states. Hereinafter, only the data reading process of the MLC flash memory (i.e., the non-volatile memory 105) will be described. It is noted that the concepts of the data reading process are also applied to the SLC flash memory and the TLC flash memory.

In practical, even if many cells are in the same storing state during the program cycle, the threshold voltages of these cells are not all identical. That is, the threshold voltages of these cells are distributed in a specified distribution curve with a median threshold voltage. As shown in FIG. 2A, the cells in the storing state E have a median threshold voltage $V_{THE}$ (e.g. 0V), the cells in the storing state A have a median threshold voltage $V_{THA}$ (e.g. 10V), the cells in the storing state B have a median threshold voltage $V_{THB}$ (e.g. 20V), and the cells in the storing state C have a median threshold voltage $V_{THC}$ (e.g. 30V). In other words, a greater number of the cells in the storing state A have the median threshold voltage $V_{THA}$ (e.g. 10V).

Please refer to FIG. 2A again. According to the above characteristics of the MLC flash memory, a read voltage set including three read voltages Vra, Vrb and Vrc is defined. During the read cycle, the controlling circuit 101 provides the three read voltages of the read voltage set to the MLC flash memory in order to detect the storing states of the cells of the MLC flash memory.

For example, when the read voltage Vrb is provided to the non-volatile memory 105, a most significant bit (MSB) of the cell can be determined. If the threshold voltage of the cell is lower than the read voltage Vrb and the cell can be turned on, the controlling circuit 101 judges that the MSB of the cell is "1". Whereas, if the threshold voltage of the cell is higher than the read voltage Vrb and the cell cannot be turned on, the controlling circuit 101 judges that the MSB of the cell is "0". Similarly, after the read voltage Vra and the read voltage Vrc are provided to the non-volatile memory 105, a least significant bit (LSB) of the cell can be determined. Consequently, the storing state E is denoted as a logic state is "11", the storing state A is denoted as a logic state "10", the storing state B is denoted as the logic state "00", and the storing state C is denoted as the logic state "01".

Similarly, the controlling circuit 101 can employ one read voltage to determine two storing states of the SLC flash memory. The controlling circuit 101 can use a read voltage set including seven read voltages to determine eight storing states of the TLC flash memory.

As mentioned above, the read voltages Vra, Vrb and Vrc are important for determining the storing states of the cells. However, after the non-volatile memory 105 has been used for a certain time period, the characteristics of the cells are subjected to changes. Under this circumstance, the threshold voltage distribution curves of the storing state of all cells in the non-volatile memory 105 are possibly changed, and the median threshold voltages are shifted. If the original read voltages Vra, Vrb and Vrc are still used to read the data of the non-volatile memory 105, the number of error bits increases. Since the number of the erroneously-judged cells is large, the ECC circuit 104 cannot effectively correct the erroneously-judged cells. Under this circumstance, the controlling circuit 101 cannot output the accurate read data to the host 14.

For solving the above drawbacks, the controlling circuit 101 has a retry table for storing plural read voltage sets. If the controlling circuit 101 confirms that a read retry operation is required, the controlling circuit 101 acquires another read voltage set including three read voltages Vra', Vrb' and Vrc' from the retry table 106. Moreover, the read voltages Vra', Vrb' and Vrc' are provided to the non-volatile memory 105 in order to read the data again.

FIG. 2B is a flowchart illustrating an error correction method for a solid state storage device according to the prior art. During the read cycle, the controlling circuit 101 performs a decoding process A. In the decoding process A, a hard decoding operation is performed according to the default read voltage set. That is, the controlling circuit 101 provides the default read voltage set to a block of the non-volatile memory 105 to acquire the read data of the block, and the ECC circuit 104 performs the hard decoding operation to correct the read data. If the error bits in the read data can be corrected, it means that the decoding operation is successfully done and the decoding process A passes. Consequently, the read data is accurately transmitted from the controlling circuit 101 to the host 14. Whereas, if the error bits in the read data cannot be corrected, no accurate read data is acquired and the decoding process A fails. Then, the controlling circuit 101 performs a read retry process.

In the read retry process, a decoding process B is firstly performed. In the decoding process B, a hard decoding operation is performed according to the retry read voltage set.

For example, M retry read voltage sets have been previously stored in the retry table 106. In the decoding process B, the controlling circuit 101 acquires a first retry read voltage set including three read voltages Vra', Vrb' and Vrc' from the retry table 106, and the ECC circuit 104 performs the hard decoding operation to correct the read data. If the error bits in the read data can be corrected, it means that the decoding operation is successfully done and the decoding process B passes. Consequently, the accurate read data is transmitted from the controlling circuit 101 to the host 14. Whereas, if the error bits in the read data cannot be corrected, no accurate read data is acquired and the decoding process B fails. Then, the controlling circuit 101 performs a read retry process. Whereas, if the error bits in the read data cannot be corrected, the controlling circuit 101 acquires a second retry read voltage set including three read voltages Vra", Vrb" and Vrc" from the retry table 106 and judges whether the decoding operation is successfully done.

As mentioned above, M retry read voltage sets are stored in the retry table 106. If the decoding operation is successfully done according to one of the M retry read voltage sets, it means that the decoding process B passes. Whereas, if the data cannot be successfully decoded according to the entire of the M retry read voltage sets, it means that the decoding process B fails. Then, the controlling circuit 101 performs a decoding process C. Obviously, the time period of performing the decoding process B is longer than the time period of performing the decoding process A.

In the decoding process C, a soft decoding operation is performed according to the retry read voltage set. Generally, the soft decoding operation has better error correction capability than the hard decoding operation. However, while the soft decoding operation is performed, the controlling circuit 101 acquires a read data according to many retry read voltage sets. In other words, the time period of performing the soft decoding operation is longer. That is, the time period of performing the decoding process C is longer than the time period of performing the decoding process B.

For example, additional N retry read voltage sets are stored in the retry table 106. If the decoding operation is successfully done according to one of the N retry read voltage sets, it means that the decoding process C passes. Whereas, if the data cannot be successfully decoded according to the entire of the N retry read voltage sets, it means that the decoding process C fails. Under this circumstance, the controlling circuit 101 confirms that the read data cannot be accurately acquired and generates a failed message to the host 14 to indicate that the decoding process fails.

As mentioned above, if the decoding process A fails, the controlling circuit 101 performs the read retry process. In the read retry process, the controlling circuit 101 has to perform the decoding process B at first. If the controlling circuit 101 confirms that the decoding process B fails, the controlling circuit 101 performs the decoding process C. If the controlling circuit 101 confirms that the decoding process C fails, the controlling circuit 101 issues the failed message to the host 14.

Moreover, the M read voltage sets in the retry table 106 are provided by the manufacturer of the non-volatile memory 105. During the read retry decoding process B of the solid state storage device 10, the controlling circuit 101 sequentially reads the M retry read voltage sets from the retry table 106 and sequentially provides the M read voltage sets to the non-volatile memory 105. Obviously, during the decoding process B, the controlling circuit 101 is only able to sequentially provide the retry read voltage sets to the non-volatile memory 105, but is unable to directly acquire the suitable retry read voltage sets. In other words, the controlling circuit 101 spends a long time providing unsuitable retry read voltage sets to the non-volatile memory 105.

Similarly, during the read retry decoding process C of the solid state storage device 10, the above problems also occur. Since the time period of performing the error correction method is very long, the read speed of the solid state storage device 10 is largely decreased.

SUMMARY OF THE INVENTION

An embodiment of the present invention provides a solid state storage device. The solid state storage includes a non-volatile memory and a controlling circuit. The non-volatile memory includes a first block. The controlling circuit is connected with the non-volatile memory. The controlling circuit includes a function storage circuit. The function storage circuit stores plural prediction functions.

According to plural state parameters corresponding to the first block and a first prediction function of the plural prediction functions, the controlling circuit predicts a read voltage shift of the first block.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5 is another example of the information table of the non-volatile memory according to an embodiment of the present invention.

DETAILED DESCRIPTION OF PREFERRED EMBODIMENTS

Figure 1:
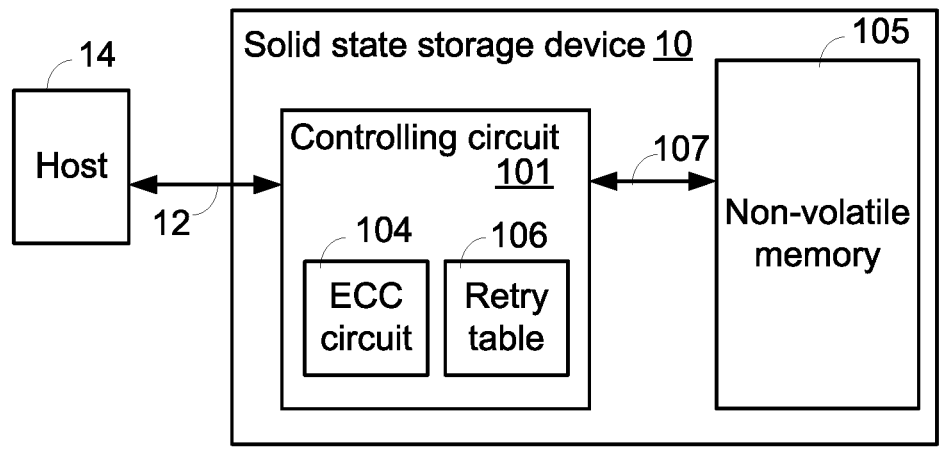
FIG. 1 (prior art) is a schematic functional block diagram illustrating a conventional solid state storage device.
Figure 2A:
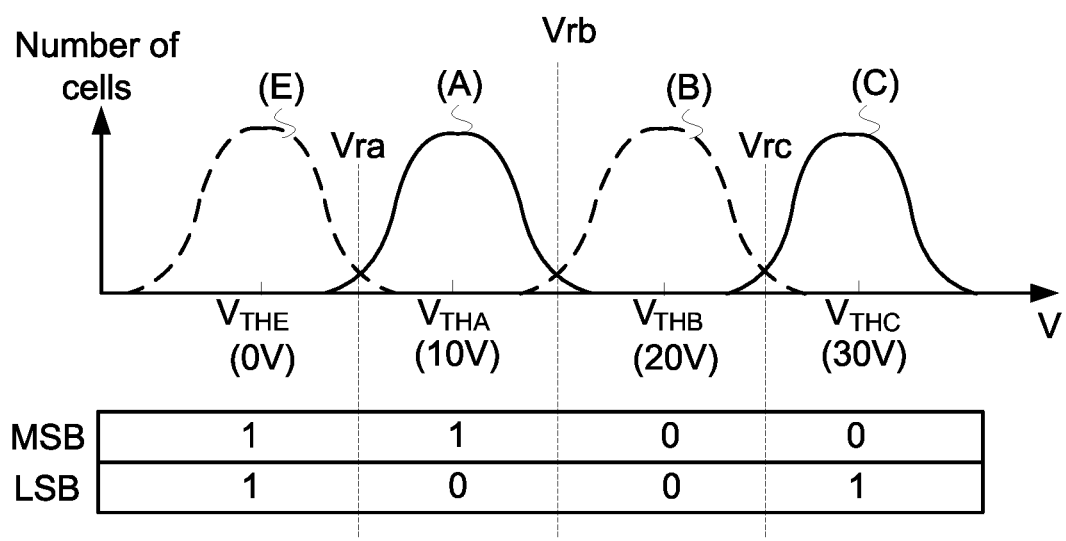
FIG. 2A (prior art) schematically illustrates the threshold voltage distribution curves of the MLC flash memory in different storing states.
Figure 2B:
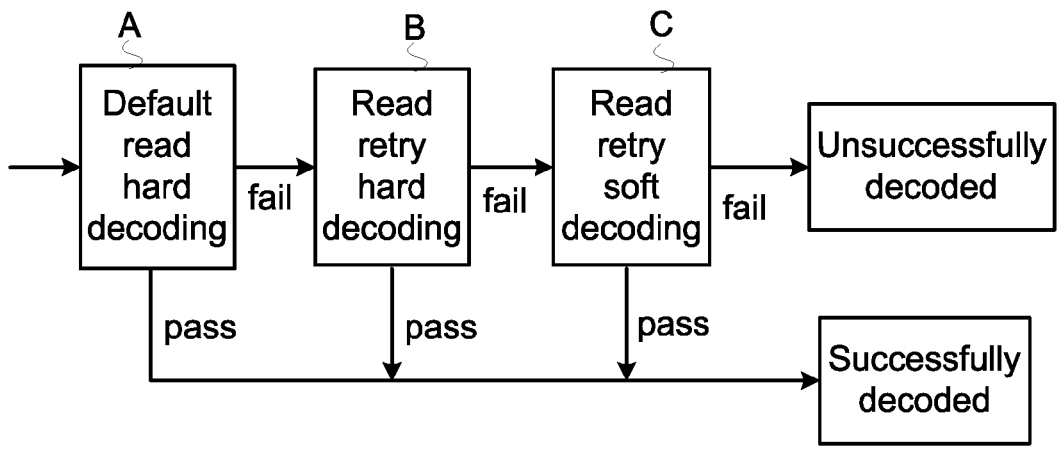
FIG. 2B (prior art) is a flowchart illustrating an error correction method for a solid state storage device according to the prior art.

The present invention provides a solid state storage device and a state prediction method thereof. Before the solid state storage device leaves the factory, various state parameters of a non-volatile memory are collected, and a prediction function associated with the non-volatile memory is obtained according to a machine learning algorithm. The prediction function is recorded in the solid state storage device. After the solid state storage device leaves the factory, the current read voltage set and the future read voltage set of the non-volatile memory and the suitable decoding process are quickly predicted according to the current state parameter and the prediction function. The decoding process A, the decoding process B and the decoding process C used in the present invention are identical to those of FIG. 2B.

Figure 3:
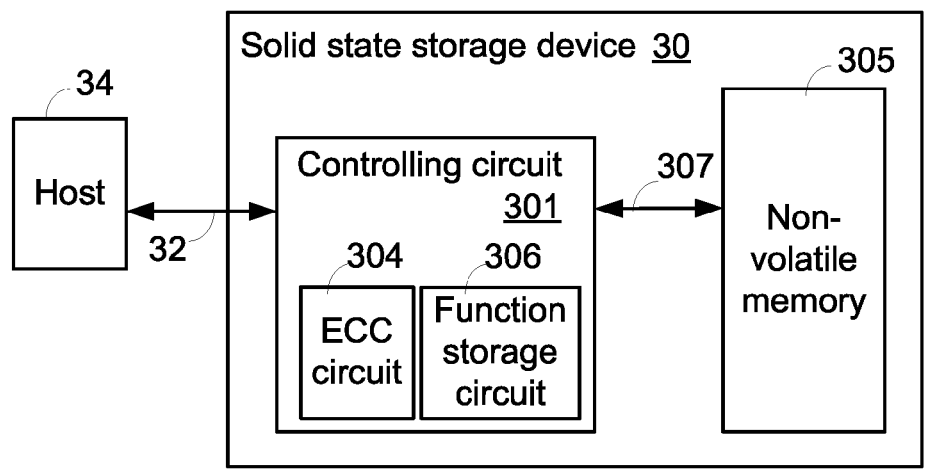
FIG. 3 is a schematic functional block diagram illustrating a solid state storage device according to an embodiment of the present invention.

FIG. 3 is a schematic functional block diagram illustrating a solid state storage device according to an embodiment of the present invention. As shown in FIG. 3, the solid state storage device 30 is connected with a host 34 through an external bus 32. Generally, the external bus 32 is a USB bus, a SATA bus, a PCIe bus, or the like. Moreover, the solid state storage device 30 comprises a controlling circuit 301 and a non-volatile memory 305. The controlling circuit 301 is connected with the non-volatile memory 305 through an internal bus 307. According to a command from the host 34, the controlling circuit 301 stores the received write data into the non-volatile memory 305, or the controlling circuit 301 acquires a read data from the non-volatile memory 305 and transmits the read data to the host 34.

The controlling circuit 301 further comprises an error correction (ECC) circuit 304 and a function storage circuit 306. The ECC circuit 304 is used for correcting the error bits of the read data. After the error bits of the read data are corrected, accurate read data are transmitted to the host 34. Moreover, plural prediction functions are stored in the function storage circuit 306. A method of establishing and using the prediction functions will be described as follows.

After the solid state storage device 30 leaves the factory, if the solid state storage device 30 has been written and erased many times, the threshold voltage distribution curves of the storing state of all cells in the non-volatile memory 305 are possibly changed. Under this circumstance, the median threshold voltage is shifted, and the solid state storage device 30 is in a read failure condition. Generally, the read failure condition includes a program disturbance condition, a data retention condition or a read disturbance condition.

Generally, after the non-volatile memory 305 has been written and erased many times, the performance of the cells is possibly deteriorated and the storing states of the cells are erroneously judged. Under this circumstance, the read failure condition is the program disturbance condition. Similarly, after the cells have been programmed and read many times, the performance of the cells is possibly deteriorated and the storing states of the cells are erroneously judged. Under this circumstance, the read failure condition is the read disturbance condition. Moreover, after the cells have been programmed and the data have been stored for a long time, the hot carriers in the cells are gradually lost and the storing states of the cells are erroneously judged. Under this circumstance, the read failure condition is the data retention condition.

For various conditions of the non-volatile memory 305, the manufacturer of the solid state storage device 30 collects plural state parameters of all blocks in the non-volatile memory 305 before the solid state storage device 30 leaves the factory. Moreover, the state parameters are contained in an information table of the non-volatile memory 305 as a database. According to the contents of the information table, the manufacturer acquires plural prediction functions. For example, the state parameters include at least one of a program count, an erase count, a program time, an erase time, an error bit number, a temperature, a read count, a histogram parameter and a read voltage interval of the corresponding block. The read voltage interval indicates the difference between two read voltages.

While the information of the information table of the non-volatile memory 305 is established, the controlling circuit 301 performs a read voltage correcting operation and a decoding process judging operation on each block. The read voltage correcting operation is used for correcting a hard read voltage to be used in the hard decoding process, a soft read voltage to be used in the soft decoding process and a log-likelihood ratio (LLR). After the read voltage correcting operation, the corrected read voltage set of each block and the corresponding decoding process are also used as the state parameters.

Figures 4A, 4B:
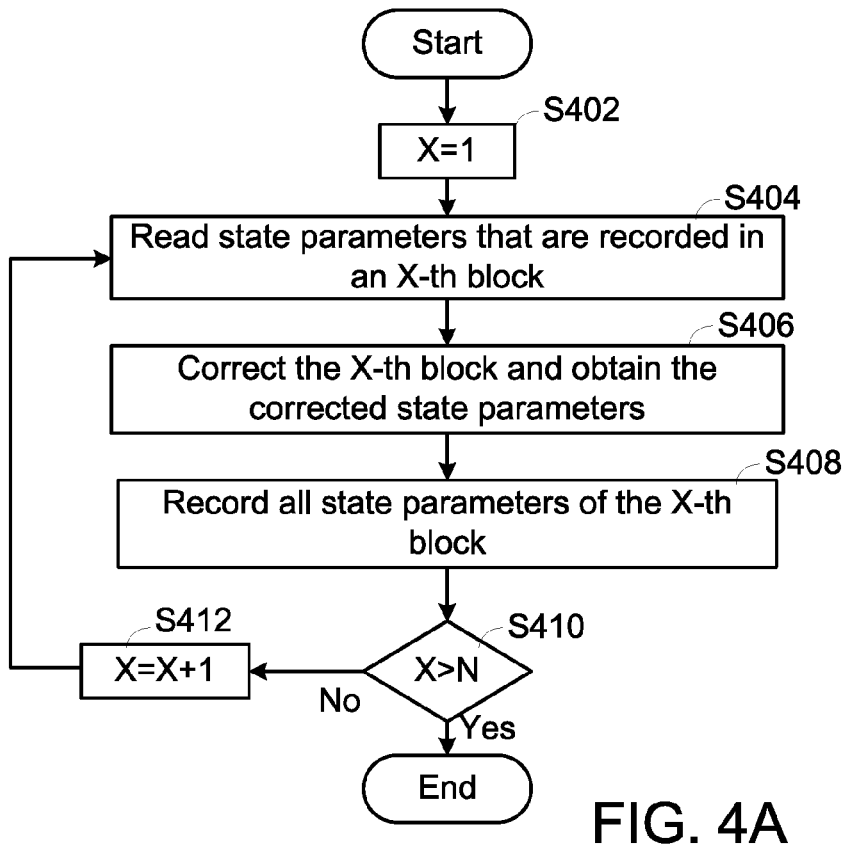
FIG. 4A is a flowchart illustrating a method of establishing an information table of the non-volatile memory of the solid state storage device according to the embodiment of the present invention.
FIG. 4B is an example of the information table of the non-volatile memory according to an embodiment of the present invention.

FIG. 4A is a flowchart illustrating a method of establishing an information table of the non-volatile memory of the solid state storage device according to the embodiment of the present invention.

The non-volatile memory comprises N blocks. Firstly, set X=1 (Step S402). Then, the state parameters recorded in an X-th block are read (Step S404). Then, the X-th block is corrected, and the corrected state parameters are obtained (Step S406). Then, all state parameters of the X-th block are recorded (Step S408). If N is not larger than N (Step S410), set X=X+1 (Step S412). Then, the steps S404-S412 is repeatedly done. If X is larger than N, the flowchart is ended. After the flowchart of FIG. 4A is completed, the state parameters of N blocks are recorded in the information table of the non-volatile memory. In this embodiment, the state parameters of the N blocks are sequentially acquired from the first block to the N-th block. Alternatively, in another embodiment, the state parameters of the N blocks are sequentially acquired from the N-th block to the first block. That is, the sequence of acquiring the state parameters of the N blocks is not restricted. Preferably, the flowchart of FIG. 4A is implemented while the solid state storage device 30 is in an idle state. Consequently, the interference on the read data or the write data will be minimized.

FIG. 4B is an example of the information table of the non-volatile memory according to an embodiment of the present invention. In FIG. 4B, the state parameters contain the program time (Pt), the erase time (Et), the error bit number (Eb), the read voltage shift (Vrb) and the decoding process (Dp). It is noted that the items of the state parameters are not restricted. In some embodiments, the state parameters may further contain the program count, the erase count, the temperature, the read count, the histogram parameter and the read voltage interval. For example, in case that the non-volatile memory 305 is a MLC flash memory, the state parameters further contain the read voltage shift (Vra) and the read voltage shift (Vrc).

Before the solid state storage device 30 leaves the factory, the manufacturer of the solid state storage device 30 collects the state parameters of N blocks in the non-volatile memory 305 according to the flowchart of FIG. 4A. In the information table of FIG. 4B, the state parameters of N blocks are collected. Generally, as the block number N increases, the accuracy of the prediction result increases. In an embodiment, the plural state parameters of at least several ten thousands of blocks are collected.

For example, the state parameters of the first block (Block_1) indicate that the program time is 1894 μs, the erase time is 5615 μs, the error bit number is 55, the read voltage shift (Vrb) is −3 and the decoding process A is the suitable decoding process. If the read voltage shift (Vrb) is −3, the read voltage shift (Vrb) is 3 voltage units smaller than the default read voltage. The voltage unit is defined by the manufacture of the non-volatile memory. For example, the voltage unit is in the range between 10 mV and 100 mV. If the voltage unit is 10 mV, Vrb=−3 indicates that the read voltage shift (Vrb) is 30 mV smaller than the default read voltage.

Similarly, the controlling circuit 301 creates the state parameters of other blocks (Block_2~Block_N) by the above method. Consequently, the information table of the non-volatile memory 305 is established.

After the information table of the non-volatile memory 305 is established, a current read voltage prediction function and a current decoding process prediction function are obtained according to a machine learning algorithm. The current read voltage prediction function is used to predict the required parameters of the hard decoding process or the soft decoding process so as to comply with the predicted decoding process.

In an embodiment, the program time (Pt), the erase time (Et) and the error bit number (Eb) are used as the input terms, and the read voltage shift (Vrb) is used as the output term. The current read voltage prediction function is acquired according to a linear regression method and recoded in the function storage circuit 306. Moreover, the current read voltage prediction function is the function of the program time (Pt), the erase time (Et) and the error bit number (Eb). That is, $Vrb(Pt, Et, Eb) = c1 \times Pt + c2 \times Et + c3 \times Eb$, wherein c1, c2 and c3 are coefficients. It is noted that the way of acquiring the current read voltage prediction function is not restricted to the linear regression method. In some other embodiments, the current read voltage prediction function is acquired according to a Lasso regression method or a Ridge regression method.

In another embodiment, the program time (Pt), the erase time (Et) and the error bit number (Eb) are used as the input terms, and the decoding process (Dp) is used as the output term. The current decoding process prediction function is acquired according to a support vector machine and recoded in the function storage circuit 306. Similarly, the current decoding process prediction function is the function of the program time (Pt), the erase time (Et) and the error bit number (Eb).

After the solid state storage device 30 leaves the factory, the current read voltage set of a specified block of the non-volatile memory 305 and the suitable decoding process are predicted according to the current state parameters of the specified block and the prediction function.

For example, if a specified block of the non-volatile memory 305 is in a read failure condition after the solid state storage device 30 leaves the factory, the state parameters of the specified block (e.g., the block program time, the block erase time and the error bit number) are substituted into the current read voltage prediction function and the current decoding process prediction function by the controlling circuit 301. Moreover, the current read voltage shift and the suitable decoding process corresponding to the specified block are also predicted.

According to the current read voltage shift and the suitable decoding process, the controlling circuit 301 can acquire the accurate read data quickly and transmit the read data to the host. In comparison with the conventional read retry process, the method of the present invention can largely reduce the retry time and increase the performance of the solid state storage device 30.

For example, if the controlling circuit 301 predicts that the decoding process C is suitable for the specified block, the controlling circuit 301 directly performs the decoding process C to acquire the accurate read data but does not perform the decoding process B.

As mentioned above, the state prediction method of the present invention can predict the read voltage and the suitable decoding process of the non-volatile memory 305. Moreover, the state prediction method of the present invention can predict the future state of the non-volatile memory 305.

Please refer to FIG. 4B again. After the information table of FIG. 4B is completed, the non-volatile memory 305 to be tested is placed for 2 months, or the scenario of the non-volatile memory 305 after being placed for 2 months is simulated. Then, the state parameters of all blocks of the non-volatile memory 305 are continuously collected.

FIG. 5 is another example of the information table of the non-volatile memory according to an embodiment of the present invention.

For example, after the first block (Block_1) has been tested for 2 months, a read voltage correcting operation and a decoding process judging operation are performed on the first block (Block_1). The state parameters of the first block (Block_1) indicate that the read voltage shift (Vrb') is −5 and the decoding process A is the suitable decoding process. That is, even if the first block (Block_1) has been tested for 2 months and the read voltage shift (Vrb') is increased, the decoding process A is still suitable.

Similarly, after the fourth block (Block_4) has been tested for 2 months, a read voltage correcting operation and a decoding process judging operation are performed on the fourth block (Block_4). The state parameters of the fourth block (Block_4) indicate that the read voltage shift (Vrb') is −15 and none of the decoding processes A, B and C is the suitable decoding process. It means that the decoding process fails. In other words, after the fourth block (Block_4) has been tested for 2 months, the fourth block (Block_4) cannot be normally accessed.

Similarly, after the information table of FIG. 5 is established, a future read voltage prediction function and a future decoding process prediction function are obtained according to a machine learning algorithm.

In an embodiment, the program time (Pt), the erase time (Et) and the error bit number (Eb) are used as the input terms, and the read voltage shift (Vrb') is used as the output term. The future read voltage prediction function is acquired according to a linear regression method and recoded in the function storage circuit 306. Moreover, the future read voltage prediction function is the function of the program time (Pt), the erase time (Et) and the error bit number (Eb). That is, Vrb'(Pt, Et, Eb)=d1×Pt+d2×Et+d3×Eb, wherein d1, d2 and d3 are coefficients. It is noted that the way of acquiring the future read voltage prediction function is not restricted to the linear regression method. In some other embodiments, the future read voltage prediction function is acquired according to a Lasso regression method or a Ridge regression method.

It is noted that the future time after the tested time is not restricted to 2 months. For example, in another embodiment, the read voltage correcting operation and the decoding process judging operation are performed after the non-volatile memory 305 has been be tested for 1 or 6 months.

In another embodiment, the program time (Pt), the erase time (Et) and the error bit number (Eb) are used as the input terms, and the 2-month decoding process (Dp') is used as the output term. The future decoding process prediction function is acquired according to a support vector machine and recoded in the function storage circuit 306. Similarly, the future decoding process prediction function is the function of the program time (Pt), the erase time (Et) and the error bit number (Eb).

After the solid state storage device 30 leaves the factory, the future read voltage set of a specified block of the non-volatile memory 305 and the suitable decoding process are predicted according to the future state parameters of the specified block and the prediction function.

The future read voltage prediction function or the future decoding process prediction function can be used to predict the future states of the blocks. Consequently, the reading speed of the solid state storage device 30 is effectively increased. The reason will be described as follows.

For example, after the state parameters of the specified block (e.g., the block program time, the block erase time and the error bit number) are substituted into the future read voltage prediction function, the controlling circuit 301 may predict that the decoding process B or the decoding process C is the suitable decoding process after 2 months. Generally, it takes much time to perform the decoding process B and the decoding process C. For maintaining the better reading speed of the solid state storage device 30, the controlling circuit 301 can previously move the data from the specified block to another block in a better condition. The block in the better condition can be successfully decoded by the decoding process A. Consequently, the reading speed of the solid state storage device 30 will not be decreased.

Alternatively, after the state parameters of the specified block (e.g., the block program time, the block erase time and the error bit number) are substituted into the future decoding process prediction function, the controlling circuit 301 may predict that the decoding process for the specified block will fail in the two months. For preventing data loss of the specified block, the controlling circuit 301 can previously store the data of the specified block in another block (e.g., a spare block).

In another embodiment, plural future read voltage prediction functions are obtained after the information table is established. For example, the future read voltage prediction functions include a 2-month read voltage prediction function, a 4-month read voltage prediction function, a 6-month read voltage prediction function and a 12-month read voltage prediction function.

Moreover, before the solid state storage device 30 is powered down, the state parameters of one or more reference blocks are stored. When the solid state storage device 30 is powered on again, the reference blocks are firstly corrected and the read voltage shifts are obtained. According to the read voltage shifts, the suitable read voltage prediction function is determined and the power-off period of the solid state storage device 30 is further calculated.

For example, after the solid state storage device 30 is powered on, the stored state parameters are substituted into all of the future read voltage prediction functions. Consequently, plural corresponding read voltage shifts are obtained. If the read voltage shifts of the corrected reference blocks are the closest to the result of the 6-month read voltage prediction function, it is estimated that the power-off period of the solid state storage device 30 is about six months.

From the above descriptions, the present invention provides a solid state storage device using a state prediction method. After the solid state storage device leaves the factory, the current read voltage set and the future read voltage set of the non-volatile memory and the suitable decoding process are quickly predicted according to the current state parameter and the prediction function.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
a non-volatile memory comprising a first block; and
a controlling circuit connected with the non-volatile memory, wherein the controlling circuit comprises a function storage circuit, and the function storage circuit stores plural prediction functions,
wherein according to plural state parameters corresponding to the first block and a first prediction function of the plural prediction functions, the controlling circuit determines a read voltage shift of the first block, wherein according to the plural state parameters corresponding to the first block and a second prediction function of the plural prediction functions, the controlling circuit determines that a second decoding process is suitable for the first block at a future time point.

2. The solid state storage device as claimed in claim 1, wherein the plural state parameters include at least one of a block program time, a block program count, a block erase time, a block erase count, a block error bit number, a block read voltage, a block decoding process, a temperature, a block read count, a histogram parameter or a read voltage interval.

3. The solid state storage device as claimed in claim 1, wherein according to the read voltage shift, the controlling circuit generates a read voltage to the first block of the non-volatile memory and acquires a read data of the first block according to the read voltage.

4. The solid state storage device as claimed in claim 3, wherein according to the plural state parameters corresponding to the first block and a third prediction function of the plural prediction functions, the controlling circuit determines that a first decoding process is suitable for the first block.

5. The solid state storage device as claimed in claim 4, wherein the controlling circuit further comprises an error correction circuit for performing the first decoding process and correcting plural error bits of the read data, thereby generating a corrected read data to a host.

6. The solid state storage device as claimed in claim 1, wherein according to the plural state parameters corresponding to the first block and a fourth prediction function of the plural prediction functions, the controlling circuit determines the read voltage shift of the first block at a future time point.

7. The solid state storage device as claimed in claim 1, wherein if the controlling circuit determines that the first block is not successfully decoded at the future time point according to the plural state parameters corresponding to the first block and the second prediction function, a data of the first block is stored into a second block by the controlling circuit.

8. The solid state storage device as claimed in claim 1, wherein the plural prediction functions are previously stored in the function storage circuit before the solid state storage device leaves a factory.

9. A solid state storage device, comprising:
a non-volatile memory comprising a first block; and
a controlling circuit connected with the non-volatile memory, wherein the controlling circuit comprises a function storage circuit, and the function storage circuit stores plural prediction functions,
wherein according to plural state parameters corresponding to the first block and a first prediction function of the plural prediction functions, the controlling circuit determines a read voltage shift of the first block,
wherein after the plural state parameters corresponding to plural blocks of the non-volatile memory are collected, the plural state parameters are recorded in an information table of the non-volatile memory, wherein first portions of the plural state parameters are set as input terms, second portions of the plural state parameters are set as output terms, and the plural prediction functions are obtained according to a machine learning algorithm which is performed according to a linear regression method, a Lasso regression method, a Ridge regression method or support vector machine.

10. A solid state storage device, comprising:
a non-volatile memory comprising a first block; and
a controlling circuit connected with the non-volatile memory, wherein the controlling circuit comprises a function storage circuit, and the function storage circuit stores plural prediction functions,
wherein according to plural state parameters corresponding to the first block and a first prediction function of the plural prediction functions, the controlling circuit determines a read voltage shift of the first block,
wherein the plural prediction functions include plural future read voltage prediction functions for calculating a power-off period of the solid state storage device at plural future time points.

11. The solid state storage device as claimed in claim 10, wherein before the solid state storage device is powered down, the plural state parameters of a reference blocks are stored, wherein when the solid state storage device is powered on again, the reference block is corrected and a read voltage shift of the reference block is obtained, wherein according to the read voltage shift, the controlling circuit determines a suitable read voltage prediction function and calculates a power-off period of the solid state storage device.

* * * * *